United States Patent [19]

Novak

[11] Patent Number: 5,029,044

[45] Date of Patent: Jul. 2, 1991

[54] CIRCUIT BOARD SPACING AND SUPPORT APPARATUS

[75] Inventor: Carl V. Novak, Pell Lake, Wis.

[73] Assignee: Motorola, Inc., Schaumburg, Ill.

[21] Appl. No.: 439,951

[22] Filed: Nov. 21, 1989

[51] Int. Cl.$^5$ .............................. H05K 7/12; F16B 5/06
[52] U.S. Cl. ........................................ 361/412; 24/336;
24/370; 24/563; 174/138 D
[58] Field of Search ............... 174/138 R, 138 D, 146;
361/412, 415, 417, 418, 419; 24/129 R, 129 A,
129 D, 336, 339, 370, 545, 563; 248/250, 500;
336/207; 338/304, 305; 446/105, 106, 107, 111,
116, 119

[56] References Cited

U.S. PATENT DOCUMENTS

| | | | |
|---|---|---|---|
| 1,163,851 | 12/1915 | Pringle | 446/106 |
| 1,574,191 | 2/1926 | Groves | 446/106 X |
| 2,733,492 | 2/1956 | Copell | 248/500 X |
| 2,844,910 | 7/1958 | Korchak | 446/106 |
| 3,066,367 | 12/1962 | Garman | 24/336 |
| 3,644,868 | 2/1972 | Nevala | 174/138 F X |

*Primary Examiner*—Laramie E. Askin
*Attorney, Agent, or Firm*—Kenneth W. Bolvin

[57] ABSTRACT

An apparatus made of a single piece of resilient material has notches (101) with narrow openings, on the same side, on each end. An indentation (103) opposite each notch (101) creates a narrow, flexible segment (106) on each end of the apparatus. A printed circuit board inserted in one of the notches (101) will cause an end section (107) adjacent the notch (101) to flex, thereby allowing the board to enter into the narrow notch opening. Once the board has been inserted, the resilient material of the apparatus will cause the flexed end section (107) to attempt to return to its original shape. This will force the end section (107) up against the board thereby holding the board in place within the notch (101). This simple design allows the apparatus to be manufactured relatively inexpensively.

2 Claims, 1 Drawing Sheet

CIRCUIT BOARD SPACING AND SUPPORT APPARATUS

FIELD OF THE INVENTION

This invention relates generally to the electronic assembly field and particularly to the circuit board spacer and support field.

BACKGROUND OF THE INVENTION

When more than one printed circuit board is installed in a device, they may be mounted one above the other to reduce the amount of space required. Spacing supporters are typically used to separate the boards for better cooling air flow and to reduce the risk of contact of circuits on the separate boards.

Spacing supporters are manufactured in various shapes and sizes depending on the application. The distance required between boards typically determines the length of the spacing supporter. The board's density typically determines the type of spacing supporter required.

Spacing supporters can be of two types: one type is inserted in a hole in the board and another is attached to the edge of the board. A spacing supporter that is inserted in a hole in the board cannot be used with a dense board since the hole takes up valuable room. In this situation, a spacing supporter that attaches to the side of the board is typically used.

A problem with edge of board supporters is that the opening in the support that retains the circuit board is typically sized so as to accept a board in its worst case thickest condition. This means that acceptable boards that are even slightly thinner can rattle and move about. This is unacceptable with respect to vibration, audible noise, and movement induced circuit noise.

Both types of spacing supporters have the common problem of being complexly shaped. The complex designs require expensive tooling to manufacture the spacing supporters. This in turn leads to more expensive spacing supporters. There is a resulting need for a less costly printed circuit board spacing supporter that can be used with dense boards and that retains the circuit board rigidly without requiring additional elements.

SUMMARY OF THE INVENTION

The present invention is an apparatus that spaces and rigidly supports printed circuit boards. This apparatus is manufactured as a single, rectangularly shaped strip of material. Each end of the strip contains a notch on the same side. On the opposite side of and immediately behind the notches are shallow indentations. The width of the apparatus from the end of each indentation to each end of the apparatus is less than the width of the mid-section of the apparatus.

The dimensions of the spacing supporter apparatus are dependent on the application. A longer apparatus and a greater distance between notches is required for an application requiring a greater distance between circuit boards. The dimensions of the notches are dependent on the thickness of the circuit boards.

The notches are positioned on the edges of the circuit boards to be separated, the upper notch of the apparatus is attached to the upper board and the lower notch to the lower board. The smaller width of the apparatus at the point of the notch and indentation allows that part to flex around the board, holding it tightly as compared to current non-flexing notches.

BEST MODE FOR CARRYING OUT THE INVENTION

The apparatus of the present invention separates and rigidly supports printed circuit boards installed within an electronic device. The apparatus, the preferred embodiment illustrated in FIG. 1, can function using minimal board space. In addition, due to the simplicity of design, it can be manufactured relatively inexpensively.

The apparatus is manufactured from a single piece of material, the preferred embodiment being plastic. The material used must be resilient, allowing the apparatus to flex without breaking and to return to its original shape after use.

Figure 2:
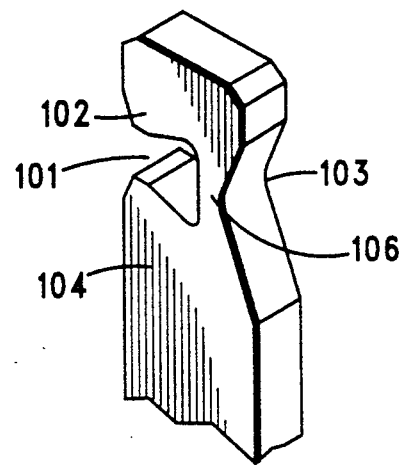
FIG. 2 shows a close up of one end of the apparatus of the present invention.
Figure 3:
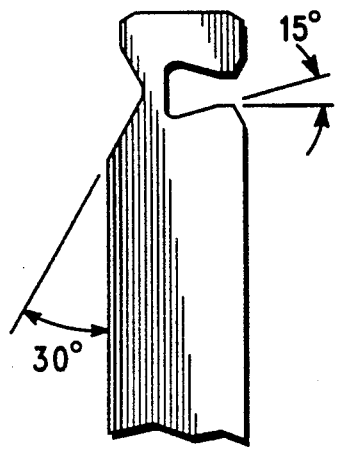
FIG. 3 shows a close up of one end of the apparatus of the present invention indicating various angles.

The apparatus includes notches (101) illustrated in FIG. 2, on the same side at each end. The center of each notch (101) is located approximately 0.090 inch from the end. The width of the notch (101) opening, 0.057±0.002 inch in the preferred embodiment, accommodates a standard width printed cirucit board. The sides of the notches (101) that face each other are angled outward by approximately 15° as illustrated in FIG. 3. This creates an opening of each of the notches (101) that is narrower than the rest of the notch (101).

Figure 1:
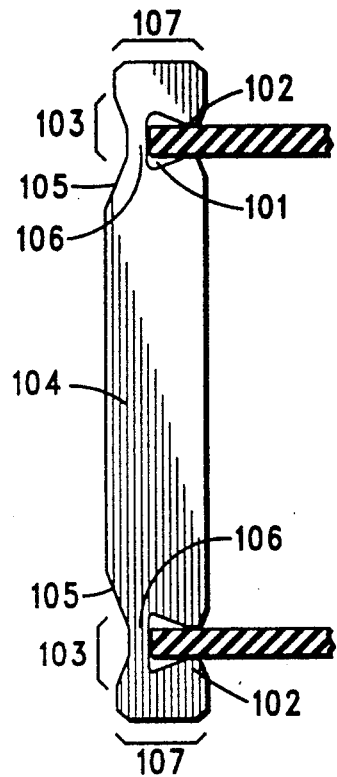
FIG. 1 shows the apparatus of the present invention in a typical application.

At each end on the opposite side of the apparatus, immediately behind each notch (101), is an indentation (103). These shallow indentations (103) are 0.030 inch deep as measured from the corresponding edge of the mid-section (104) of the apparatus. The initial slope (105) of the indentation (103) is approximately 30° from the corresponding edge of the mid-section (104) as illustrated in FIG. 3. These indentations (103) may be flat as shown in FIG. 1 or form a radius as shown in FIG. 3. The indentation (103), in conjunction with the notch (101), creates a narrow, flexible section (106) at each end of the apparatus.

The end section (107) of the apparatus after the indentation is a narrower width than the mid-section (104). The width of the mid-section (104) is approximately 0.130 inch while the end sections (107) are approximately 0.115 inch.

The circuit board spacing and support apparatus operates, as illustrated in FIG. 1 and FIG. 2, by inserting a board in each notch (101). For correct operation, the opening of the notch (101) should be narrower than the thickness of the circuit board. The narrow, flexible region (106) created by the combination of a notch (101) and an indentation (103) flexes, allowing the thicker board to be inserted. Once the board is inserted, the flexible part, attempting to return to its original shape, will force the upper part (102) of the notch to put pressure on the board. This pressure will hold the board in place against the lower part of the notch. Due to the small area that is in contact with the board, minimal board space is required to hold the board solidly.

Figure 4:
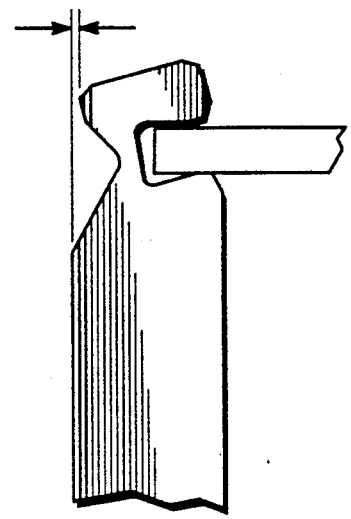
FIG. 4 shows the apparatus of the present invention used with a worst case thickness circuit board.

FIG. 4 illustrates the apparatus of the present invention used with a circuit board having a worst case thickness. The narrower end of the apparatus can flex back without protruding past the outside surface of the apparatus. This allows the apparatus to be used with thicker boards without requiring additional space.

The dimensions and material of this apparatus will vary depending on the application. The length of the apparatus and the distance between the notches (101) will vary depending on the distance required between the boards. The thickness of the apparatus will vary depending on the strength required. The composition of the apparatus may be a high temperature material when the environment has a high ambient temperature.

The printed circuit board spacing and support apparatus disclosed above is relatively inexpensive to manufacture due to its simple design. An additional benefit is that very little board space is required since holes in the board are not needed and the apparatus rigidly grips the board with a small surface area.

Those skilled in the art will recognize that various modifications and changes could be made to the apparatus of the present invention without departing from the spirit and scope thereof. It should therefore be understood that the claims are not to be considered as being limited to the precise embodiment set forth in the absence of specific limitations directed to such embodiments.

I claim:

1. A spacing and support apparatus for holding a plurality of circuit boards, each circuit board having a predetermined thickness, the apparatus comprising:
   (a) a flat, elongated strip of resilient material having a first end section, a second end section, a first side, and a second side, the second side parallel to the first side and the first and second end sections offset from the second side towards the first side;
   (b) a first notch, located in the first end section and having an opening on the first side and a rear wall substantially opposite the opening, the rear wall having a length, the opening being narrower than the length and the predetermined thickness;
   (c) a second notch, located in the second end section and having an opening on the first side and a rear wall substantially opposite the opening, the rear wall having a length, the opening being narrower than the length and the predetermined thickness;
   (d) a first indentation, located in the first end section on the second side and substantially opposite the first notch, the first indentation allowing the opening of the first notch to expand to hold a first circuit board of the plurality of circuit boards; and
   (e) a second indentation, located in the second end section on the second side and substantially opposite the second notch, the second indentation allowing the opening of the second notch to expand to hold a second circuit board of the plurality of circuit boards.

2. An electronic device, comprising:
   (a) a plurality of circuit boards, each circuit board having a predetermined thickness; and
   (b) a spacing and support apparatus for holding the plurality of circuit boards, the spacing and support apparatus comprising:
      a flat, elongated strip of resilient material having a first end section, a second end section, a first side, and a second side, the second side parallel to the first side and the first and second end sections offset from the second side towards the first side;
      a first notch, located in the first end section and having an opening on the first side and a rear wall substantially opposite the opening, the rear wall having a length, the opening being narrower than the length and the predetermined thickness;
      a second notch, located in the second end section and having an opening on the first side and a rear wall substantially opposite the opening, the rear wall having a length, the opening being narrower than the length and the predetermined thickness;
      a first indentation, located in the first end section on the second side and substantially opposite the first notch, the first indentation allowing the opening of the first notch to expand to hold a first circuit board of the plurality of circuit boards; and
      a second indentation, located in the second end section on the second side and substantially opposite the second notch, the second indentation allowing the opening of the second notch to expand to hold a second circuit board of the plurality of circuit boards.

* * * * *